(12) United States Patent
Kim et al.

(10) Patent No.: US 11,410,814 B2
(45) Date of Patent: Aug. 9, 2022

(54) MULTILAYER ELECTRONIC COMPONENT

(71) Applicant: SAMSUNG ELECTRO-MECHANICS CO., LTD., Suwon-si (KR)

(72) Inventors: Seul Gi Kim, Suwon-si (KR); Jin Sung Chun, Suwon-si (KR); Chang Yong Choi, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/176,597

(22) Filed: Feb. 16, 2021

(65) Prior Publication Data
US 2022/0076888 A1   Mar. 10, 2022

(30) Foreign Application Priority Data

Sep. 4, 2020 (KR) .......................... 10-2020-0113162

(51) Int. Cl.
| | |
|---|---|
| *H01G 4/30* | (2006.01) |
| *H01G 4/224* | (2006.01) |
| *H01G 4/012* | (2006.01) |
| *H01G 4/08* | (2006.01) |
| *H03H 1/00* | (2006.01) |

(52) U.S. Cl.
CPC ............ *H01G 4/224* (2013.01); *H01G 4/012* (2013.01); *H01G 4/08* (2013.01); *H01G 4/30* (2013.01); *H03H 2001/0085* (2013.01)

(58) Field of Classification Search
CPC .......... H01G 4/224; H01G 4/012; H01G 4/08; H01G 4/30; H03H 2001/0085
See application file for complete search history.

(56) References Cited

U.S. PATENT DOCUMENTS

| | | | | |
|---|---|---|---|---|
| 11,264,173 | B2 * | 3/2022 | Kang | H01G 4/228 |
| 2016/0268047 | A1 * | 9/2016 | Shin | H01G 4/232 |
| 2018/0102217 | A1 * | 4/2018 | Fukunaga | H01G 4/232 |
| 2019/0164693 | A1 * | 5/2019 | Ono | H01G 4/30 |
| 2019/0318872 | A1 * | 10/2019 | Mizuno | H01G 4/232 |
| 2020/0152391 | A1 * | 5/2020 | Kang | H01G 4/12 |
| 2020/0258689 | A1 * | 8/2020 | Kato | H01G 4/1209 |

(Continued)

FOREIGN PATENT DOCUMENTS

| | | | | | |
|---|---|---|---|---|---|
| JP | 2014068000 | A | * | 4/2014 | H01G 13/00 |
| JP | 2017191860 | A | * | 10/2017 | H01G 4/005 |

(Continued)

*Primary Examiner* — Dion R. Ferguson
(74) *Attorney, Agent, or Firm* — Morgan, Lewis & Bockius LLP (57) ABSTRACT

A multilayer electronic component includes a body comprising a capacitance-forming portion including a dielectric layer and a plurality of internal electrodes layered with the dielectric layer interposed therebetween, and upper and lower cover portions disposed on upper and lower surfaces of the capacitance-forming portion, respectively; and external electrodes disposed on the body and electrically connected to at least some of the plurality of internal electrodes, respectively, wherein at least one of the upper cover portion and or the lower cover portion has a step structure, and the step structure has a shorter length and width as compared to the capacitance-forming portion.

20 Claims, 9 Drawing Sheets

(56) References Cited

U.S. PATENT DOCUMENTS

| | | | |
|---|---|---|---|
| 2021/0225594 A1* | 7/2021 | Hashimoto | H01G 4/248 |
| 2021/0257160 A1* | 8/2021 | Yoshida | H01G 4/1218 |
| 2022/0076888 A1* | 3/2022 | Kim | H01G 4/08 |

FOREIGN PATENT DOCUMENTS

| | | | | | |
|---|---|---|---|---|---|
| JP | 2017191861 A | * | 10/2017 | | H01G 4/012 |
| JP | 2019-186394 A | | 10/2019 | | |
| JP | 2020102479 A | * | 7/2020 | | H01G 4/012 |
| JP | 2020191330 A | * | 11/2020 | | H01G 4/008 |
| KR | 10-2013-0061260 A | | 6/2013 | | |
| KR | 20130061260 A | * | 6/2013 | | H01G 4/12 |
| KR | 101901708 B1 | * | 9/2018 | | H01G 4/232 |
| KR | 20210052242 A | * | 2/2021 | | H01G 4/232 |

\* cited by examiner

MULTILAYER ELECTRONIC COMPONENT

CROSS-REFERENCE TO RELATED APPLICATION(S)

This application claims the benefit of priority to Korean Patent Application No. 10-2020-0113162 filed on Sep. 4, 2020 in the Korean Intellectual Property Office, the disclosure of which is incorporated herein by reference in its entirety.

TECHNICAL FIELD

The present disclosure relates to a multilayer electronic component.

BACKGROUND

A multilayer ceramic capacitor (MLCC) is a chip-type condenser mounted on the printed circuit boards of a variety of electronic products such as an image display device, including liquid crystal displays (LCD) and plasma display panels (PDP), computers, smartphones, cellular phones, and the like, serving to charge and discharge electricity.

A multilayer ceramic capacitor may be used as a component of various electronic devices as it is relatively small in size and is able to secure high capacity, while being easily installed. As electronic devices such as computers, mobile devices, and the like, are miniaturized and increased in power, there has been increased demand for miniaturized and high capacity multilayer ceramic capacitors.

Meanwhile, there has been an issue of chipping defects, breakage of edges of chips caused by collisions between chips during the process of manufacturing a multilayer ceramic capacitor. In particular, there may be an issue of a corner coverage defect in the case in which a portion of a corner is insufficiently applied during an electrode application process. Such defects on a chip may cause exterior defects and degradation of moisture resistance reliability.

In this regard, conventionally, corners of a body have been ground to be rounded to prevent chipping defects. A wet grinding method, mainly used in an MLCC manufacturing process, involves adding a large amount of chips and an abrasive to a water-containing barrel and rotating the same to grind corners of the chips through friction.

However, such a grinding method may further lead to additional breakage, such as chip cracking, due to impacts caused by friction with the abrasive, and moisture resistance reliability may be further reduced due to moisture which has not completely evaporated after the wet grinding process.

SUMMARY

An aspect of the present disclosure is to provide a multilayer electronic component having ameliorated exterior defects and improved moisture resistance reliability.

According to an exemplary embodiment of the present disclosure, a multilayer electronic component includes a body comprising a capacitance-forming portion including a dielectric layer and a plurality of internal electrodes layered with the dielectric layer interposed therebetween, and upper and lower cover portions disposed on upper and lower surfaces of the capacitance-forming portion, respectively; and external electrodes disposed on the body and electrically connected to at least some of the plurality of internal electrodes, respectively, wherein at least one of the upper cover portion or the lower cover portion has a step structure, and the step structure has a shorter length and width as compared to the capacitance-forming portion.

According to another exemplary embodiment, a multilayer electronic component includes a body comprising a capacitance-forming portion comprising a dielectric layer and a plurality of internal electrodes layered with the dielectric layer interposed therebetween, and upper and lower cover portions disposed on upper and lower surfaces of the capacitance-forming portion, respectively; and external electrodes disposed on the body and electrically connected to at least some of the plurality of internal electrodes, respectively, wherein at least one of the upper cover portion or the lower cover portion has a shorter length and width and a higher side surface roughness as compared to the capacitance-forming portion.

According to still another exemplary embodiment, a multilayer electronic component includes a body comprising a capacitance-forming portion including a dielectric layer and a plurality of internal electrodes layered with the dielectric layer interposed therebetween in a thickness direction, and upper and lower cover portions disposed on upper and lower surfaces of the capacitance-forming portion, respectively, in the thickness direction; and external electrodes disposed on the body and electrically connected to at least some of the plurality of internal electrodes, respectively. At least one of the upper cover portion or the lower cover portion has a plurality of step-shape layers layered in the thickness direction. The plurality of step-shape layers have different cross-sectional areas from each other with respect to the thickness direction, and the cross-sectional areas decrease as being closer to an external surface of the body.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings. The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. Accordingly, shapes and sizes of elements in the drawings may be exaggerated for clear description, and elements indicated by the same reference numeral are same elements in the drawings.

In the drawings, certain elements may be omitted to clearly describe the present disclosure, and to clearly express a plurality of layers and areas, thicknesses may be magnified. The same elements having the same function within the scope of the same concept will be described using the same reference numeral. Further, throughout the specification, it will be understood that when a portion "includes" an element, it can further include another element, not excluding another element, unless otherwise indicated.

In the drawing, a X direction may refer to a first direction, an L direction or a length direction, and a Y direction may refer to a second direction, a W direction or a width direction, while a Z direction may refer to a third direction, a layering direction, a T direction or a thickness direction.

Figure 1:
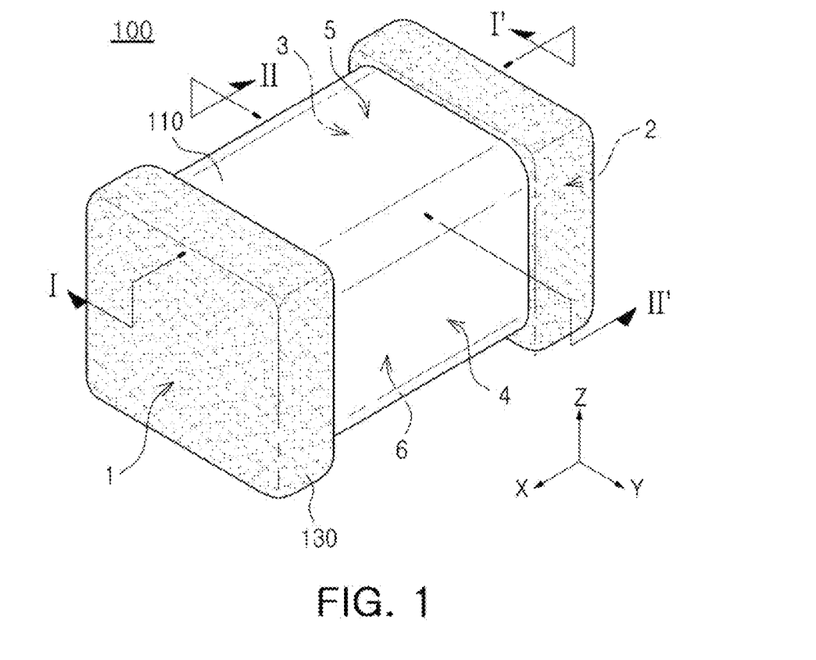
FIG. 1 is a schematic diagram illustrating a multilayer electronic component according to an exemplary embodiment in the present disclosure.
Figure 2:
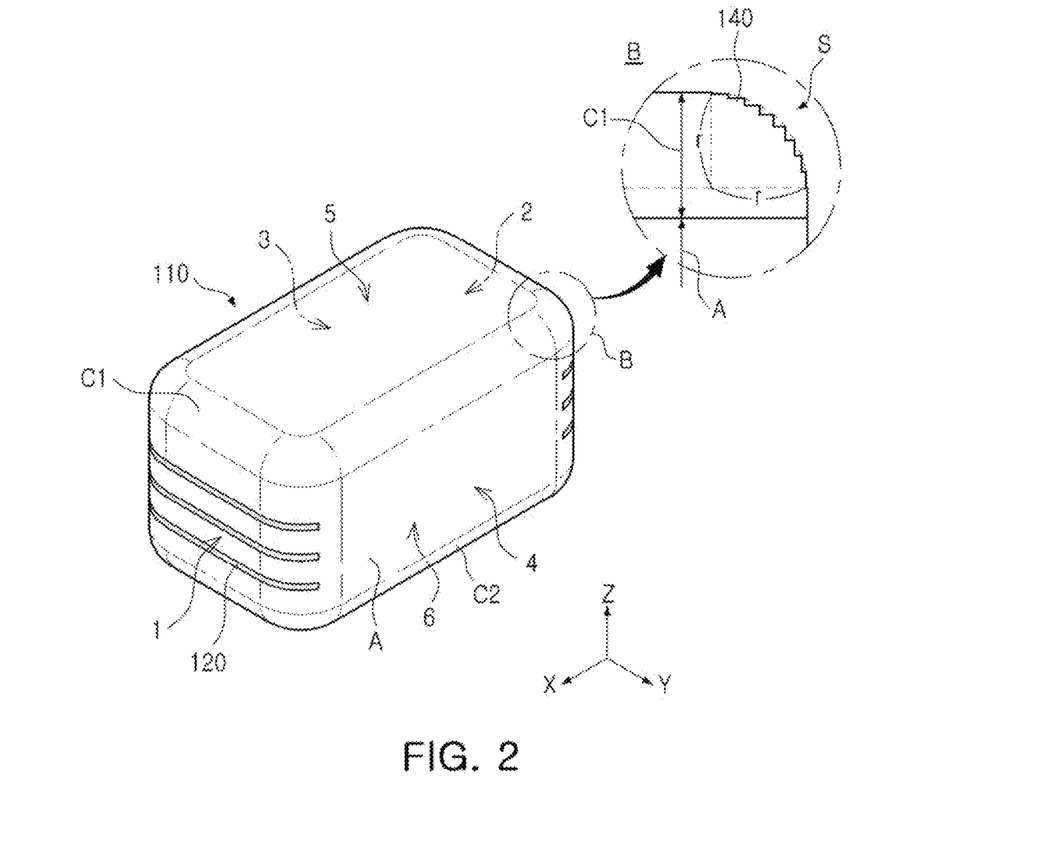
FIG. 2 is a schematic diagram illustrating a body in FIG. 1.
Figure 3:
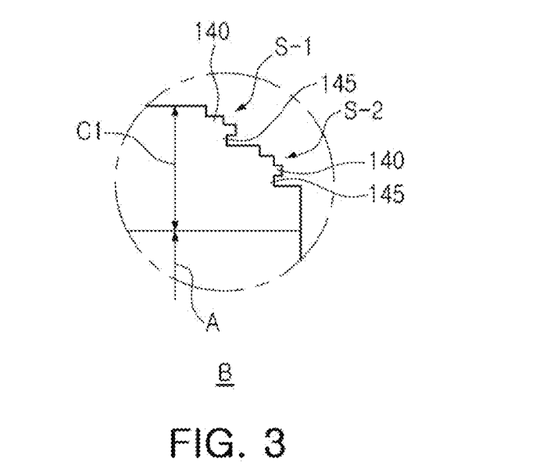
FIG. 3 is a diagram illustrating another exemplary embodiment of an enlarged view of "B" of FIG. 2.
Figure 4:
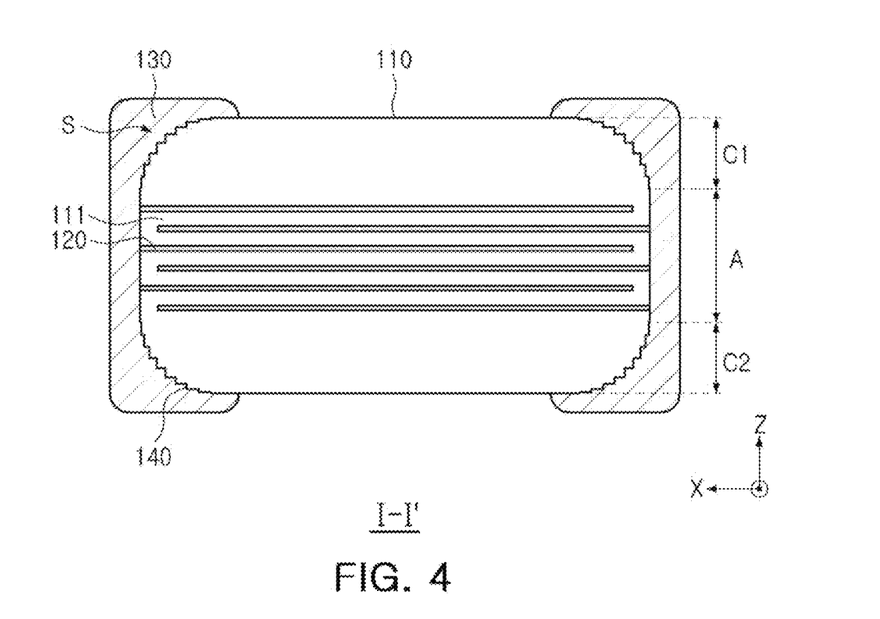
FIG. 4 is a cross-sectional diagram taken along line I-I' in FIG. 1.
Figure 5:
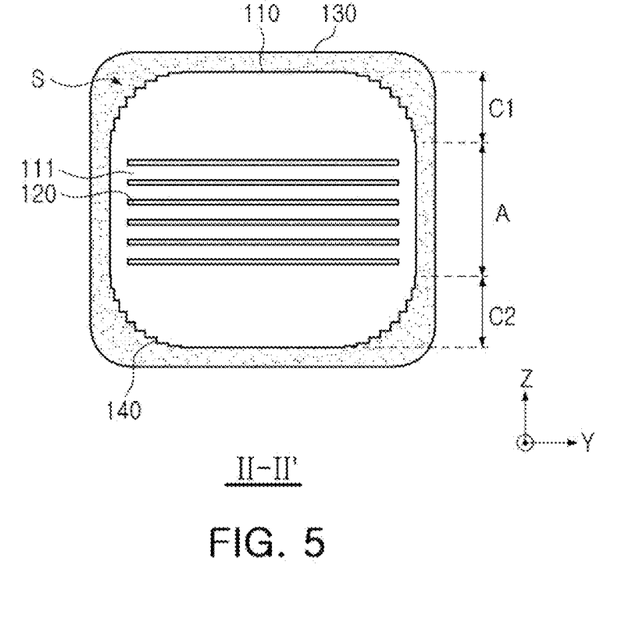
FIG. 5 is a cross-sectional diagram taken along line II-II' in FIG. 1.
Figure 6:
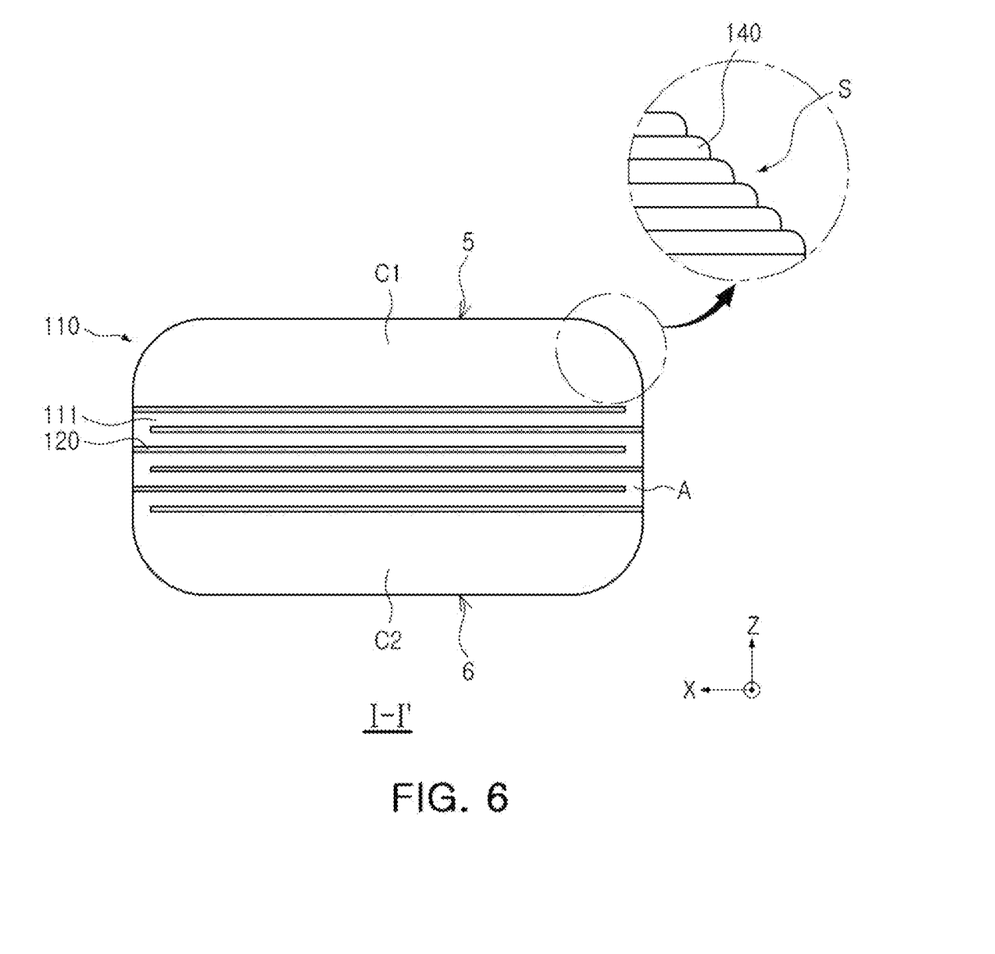
FIG. 6 is a perspective view schematically illustrating a disassembly of a step structure employable in the multilayer electronic component of FIG. 1.

FIG. 1 is a schematic diagram illustrating a multilayer electronic component according to an exemplary embodiment in the present disclosure, and FIG. 2 is a schematic diagram illustrating a body in FIG. 1. FIG. 3 is a diagram illustrating another exemplary embodiment of an enlarged view of "B" of FIG. 2, and FIG. 4 is a cross-sectional diagram taken along line I-I' in FIG. 1. FIG. 5 is a cross-sectional diagram taken along line II-II' in FIG. 1, and FIG. 6 is a perspective view schematically illustrating a disassembly of a step structure employable in the multilayer electronic component of FIG. 1.

A multilayer electronic component according to an exemplary embodiment will be described in detail with reference to FIGS. 1 to 6.

A multilayer electronic component 100 according to an exemplary embodiment may include a body 110 including a capacitance-forming portion A including a dielectric layer 111 and a plurality of internal electrodes 120 layered with the dielectric layer 111 interposed therebetween in the Z direction, and upper and lower cover portions C1 and C2 disposed on upper and lower surfaces of the capacitance-forming portion A in the Z direction; and an external electrode 130 disposed on the body 110 and electrically connected to the plurality of internal electrodes 120, wherein at least one of the upper cover portion C1 or the lower cover portion C2 has a step structure S. The step structure S has shorter length and width as compared to the capacitance-forming portion A.

In the body 110, a plurality of dielectric layers 111 and the internal electrodes 120 are alternately layered.

A shape of the body 110 is not limited to any particular shape. As illustrated in FIGS. 1 and 2, however, the body 110 may have a hexahedral shape or any shape similar thereto. In addition, due to contraction of ceramic powder included in the body 110 during a sintering process, the body 110 may have a substantially hexahedral shape, not a completely cuboid shape.

The body 110 may have first and second surfaces 1 and 2 opposing each other in the first direction (X direction), third and fourth surfaces 3 and 4 connected to the first and second surfaces 1 and 2 and opposing each other in a second direction (Y direction), and fifth and sixth surfaces 5 and 6 connected to the first to fourth surface 1 to 4 and opposing each other in a third direction (Z direction).

The plurality of dielectric layers 111 forming the body 110 are in a sintered state, and the dielectric layers 111 may be integrated such that boundaries between neighboring dielectric layers 111 may be difficult to identify without using a scanning electron microscope (SEM).

A material of the dielectric layer 111 may not be limited to any particular material as long as sufficient capacitance can be obtained therewith. For example, the dielectric layer 111 may be formed of a barium titanate ($BaTiO_3$) powder, a lead composite perovskite-based material, a strontium titanate ($SrTiO_3$)-based material, or the like. The material of the dielectric layer 111 may include various ceramic additives, organic solvents, plasticizers, coupling agents, dispersing agents, and the like, added to barium titanate ($BaTiO_3$) ceramic powder, or the like, depending on an intended purpose.

The body 110 includes the capacitance-forming portion A disposed therein and the upper and lower cover portions C1 and C2 disposed on upper and lower surfaces of the capacitance-forming portion A, respectively.

The capacitance-forming portion A contributes to capacitance formation of the multilayer electronic component 100 and includes the plurality of internal electrodes 120 layered with the plurality of dielectric layers 111 interposed therebetween. The upper and lower cover portions C1 and C2 may be formed by vertically layering the dielectric layers 111 in the upper and lower portions of the capacitance-forming portion A and accordingly may serve to prevent damage to the internal electrodes due to physical or chemical stress.

According to an exemplary embodiment, at least one of the upper cover portion C1 or the lower cover portion C2 has a step structure S. That is, only one thereof may have the step structure S or, both cover portions C1 and C2 may have the step structure S so as to be symmetric in a third direction as illustrated in FIGS. 2 to 5.

In addition, the step structure S may include a plurality of step-shape layers 140. In this case, the term "step-shape layer 140" refers to a layered dielectric layer 111 having a step. A number of the step-shape layers 140 included in a single step structure S may be unlimitedly various.

The step structure S is a structure for smoothly forming a corner of the body 110 and is thus formed to be shorter and narrower than the capacitance-forming portion A. A shape of the corner of the body 110 due to the step structure S may be various; however, it is advantageous that the shape be round or similar thereto for prevention of breakage of the body 110. Accordingly, preferably, the corner of the body 110 may have around shape in a region in which the step structure S is prepared.

To allow the step-shape layer 140 to have a step, neighboring step-shape layers 140 have different lengths or widths. That is, the plurality of step-shape layers 140 has different lengths or widths or different lengths and widths.

For example, as illustrated in FIG. 4, the upper and lower cover portions C1 and C2 are layered in the third direction (Z direction) and may include the plurality of step-shape layers 140 having different lengths with respect to the first direction (X direction). More specifically, the plurality of step-shape layers 140 included in the upper cover portion C1 has a shorter length with respect to the first direction (X direction) as disposed close to the fifth surface 5, and the plurality of step-shape layers 140 included in the lower cover portion C2 has a shorter length with respect to the first direction (X direction) as disposed close to the sixth surface 6.

Alternately, as illustrated in FIG. 5, the upper and lower cover portions C1 and C2 are layered in the third direction (Z direction) and may include the plurality of step-shape layers 140 having different lengths with respect to the second direction (Y direction). More specifically, the plurality of step-shape layers 140 included in the upper cover portion C1 has a shorter width with respect to the second direction (Y direction) as disposed close to the fifth surface 5, and the plurality of step-shape layers 140 included in the lower cover portion C2 has a shorter width with respect to the second direction (Y direction) as disposed close to the sixth surface 6.

Further, a shape of the step-shape layer 140 is not limited to a particular shape. For example, the step-shape layer 140 may be formed such that an upper surface and a side surface thereof form a rectangular shape or a certain angle with respect to each other, as illustrated in FIGS. 2 to 5. Alternately, as it will be described with reference to FIGS. 7 to 9 later, a side surface of the step-shape layer 140 may be curved.

As an example, in the case in which the upper and side surfaces of the step-shape layer 140 form a right angle, the step-shape layer 140 may have a plate shape having a rectangular cross-section as illustrated in FIG. 6. In this case, the plurality of step-shape layer 140 is layered to form a single step structure S, and accordingly, it is preferable that the neighboring step-shape layers 140 be disposed to have different cross-sectional areas.

That is, the plurality of step-shape layers 140 included in the upper or lower cover portions C1 or C2 may have different cross-sectional areas with respect to the third direction while having the same thickness. For example, based on FIG. 6, an uppermost step-shape layer 140-1 has a smallest cross-sectional area 140S-1, and a neighboring step-shape layer 140-2 disposed therebelow may have a larger cross-sectional area 140S-2 compared to the same. Likewise, the step-shape layers 140-3 and 140-4 having increasing cross-sectional areas 140S-3 and 140S-4 may be disposed toward a lower portion of the body 110. Such disposition of the step-shape layers 140, when layered, may overall serve to form a single step structure S having steps.

By forming the step structure S in which the plurality of step-shape layers 140 are layers in the upper and lower portions of the body 110, the corner of the body 110 may be managed to have a round shape during layering of a manufacturing process. That is, according to an exemplary embodiment including the step structure S, the corner of the body 110 may be manufactured to be round without grinding the corner of the body 110.

In this regard, chipping defects and corner coverage defects of the external electrode of the body 110 may be inhibited, and further, additional breakage or reduced moisture resistance reliability of the body 110 due to grinding may be prevented.

Additionally, in the case in which the corner of the body 110 has a rounded shape, a radius of curvature r thereof may be managed to be a certain value as illustrated in FIG. 2. For example, the radius of curvature r of the rounded shape can be managed to be 0.7 to 1 with respect to a thickness of the upper or lower cover portion C1 or C2.

As a specific example, in the case in which the radius of curvature r is 1 with respect to a thickness of the upper cover portion C1, all dielectric layers 111 forming the upper cover portion C1 are the plurality of step-shape layers 140 having a step. In contrast, in the case in which the radius of curvature r is 0.7 with respect to a thickness of the upper cover portion C1, the upper dielectric layers 111, among all dielectric layers 111 forming the upper cover portion C1, accounting for a ratio of 0.7 are the plurality of step-shape layers 140 having a step, and the lower dielectric layers 111 accounting for a ratio of 0.3 are the dielectric layers 111 having constant length and width.

As the above, an exemplary embodiment, in which the width and length of the upper cover portion C1 gradually decrease in a direction away from the capacitance-forming portion A, is illustrated in FIG. 2. However, an exemplary embodiment, in which the width and length of the upper cover portion C1 irregularly change in some regions, is illustrated in FIG. 3.

Hereinbelow, a description regarding the upper cover portion C1 of FIG. 3 may be applied to the lower cover portion C2.

According to another exemplary embodiment, a portion of the upper cover portion C1 forms the step structure S, and the remaining portion may not form the step structure S. That is, as illustrated in FIG. 3, a portion of the upper cover portion C1 may have an irregularly layered structure not forming the step structure S.

For example, the upper cover portion C1 may include a plurality of step structures S. More specifically, the upper cover portion C1 may simultaneously have a first step structure S-1 and a second step structure S-2. In this case, a number of the step-shape layers 140 forming the first and second step structures S-1 and S-2 may be the same or different. Further, a space therebetween may be various.

In FIG. 3, only an exemplary embodiment in which two step structures S are included in a single cover portion C1 is illustrated; however, three or more additional step structures S3 may be included.

Meanwhile, the cover portion including the step structure S may further include an irregular layer 145 not formed with the step structure S. That is, as illustrated in FIG. 3, the upper cover portion C1 may include both the step structure S and at least one irregular layer 145.

The term "irregular layer" 145 refers to a dielectric layer 111 of the cover portion layered while having a feature against a corresponding rule in the case in which the plurality of step-shape layers 140 are layered under a certain rule. For example, while the plurality of step-shape layers 140 are layered under the rule that widths and lengths thereof are gradually reduced in a direction away from the capacitance-forming portion A, there may be an irregular layer 145 having increased length and width.

As an example, in the case in which the upper cover portion C1 have the first and second step structures S-1 and S-2 layered under a certain rule as illustrated in FIG. 3, an irregular layer 145 inconsistent with a rule of any of the first and second step structures S-1 and S-2 may be formed between the two step structures.

In this case, not only an exemplary embodiment in which a single irregular layer 145 is included between the plurality of step structures S but also an exemplary embodiment in which a plurality of irregular layers 145 are consecutively layered are feasible. Further, as illustrated in FIG. 3, an irregular layer 145 may be formed between the step structure S and the capacitance-forming portion A.

The internal electrodes 120 and the dielectric layers 111 are alternately layered. That is, the plurality of internal electrodes 120 are alternately disposed to oppose each other with the dielectric layer 111 forming the body 110 interposed therebetween. Alternatively, as illustrated in FIG. 2, the internal electrodes 120 may be exposed to the first and second surfaces 1 and 2 of the body 110.

In this case, the internal electrodes 120 may be electrically isolated from each other by the dielectric layer 111 interposed therebetween. The body 110 may be formed by alternately layering green sheets, on which internal electrodes having different polarities are printed, and sintering the same.

A material of the internal electrodes 120 may not be limited to any particular material. The internal electrodes 120 may be formed of, for example, a conductive paste formed of a precious metal material, such as palladium (Pd), palladium-silver (Pd—Ag) alloy, and the like, and at least one of nickel (Ni) or copper (Cu).

As a printing method of the conductive paste, a screen printing method, a gravure printing method, or the like, may be used, but the method is not limited thereto.

The external electrodes 130 may be disposed on the body 110 and may be connected to the internal electrodes 120. As illustrated in FIG. 4, the external electrodes 130 may be disposed on both sides of the body 110 and connected to the alternately layered internal electrodes 120. In the exemplary embodiment, the multilayer electronic component 100 is illustrated as having two external electrodes 130, but a number and a shape of the external electrodes 130 may vary depending on a shape of the internal electrodes 120 or other intended purpose.

Meanwhile, a material of the external electrodes 130 may not be limited to any particular material as long as the material has electrical conductivity, such as metal, and a specific material may be determined in consideration of electrical properties, structural stability, and the like. The external electrodes 130 may further have a multilayer structure.

For example, the external electrodes 130 may include an electrode layer disposed on the body 110 and a plating layer disposed on the electrode layer. More specifically, the electrode layer may be, for example, a sintered layer including a conductive metal and glass, and the conductive metal may be Cu. Alternately, the electrode layer may be a resin electrode including a plurality of metal particles and a conductive resin.

As a specific example, the plating layer may be an Ni-plated layer or an Sn-plated layer. The plating layer may be in the form in which the Ni-plated layer and the Sn-plated layer are sequentially formed on the electrode layer, or include a plurality of Ni-plated layers and/or Sn-plated layers.

According to another exemplary embodiment, side surfaces of the plurality of step-shape layers 140 may be curved. Such an exemplary embodiment is illustrated in FIGS. 7 to 9, and will thus be described with reference thereto.

Figure 7:
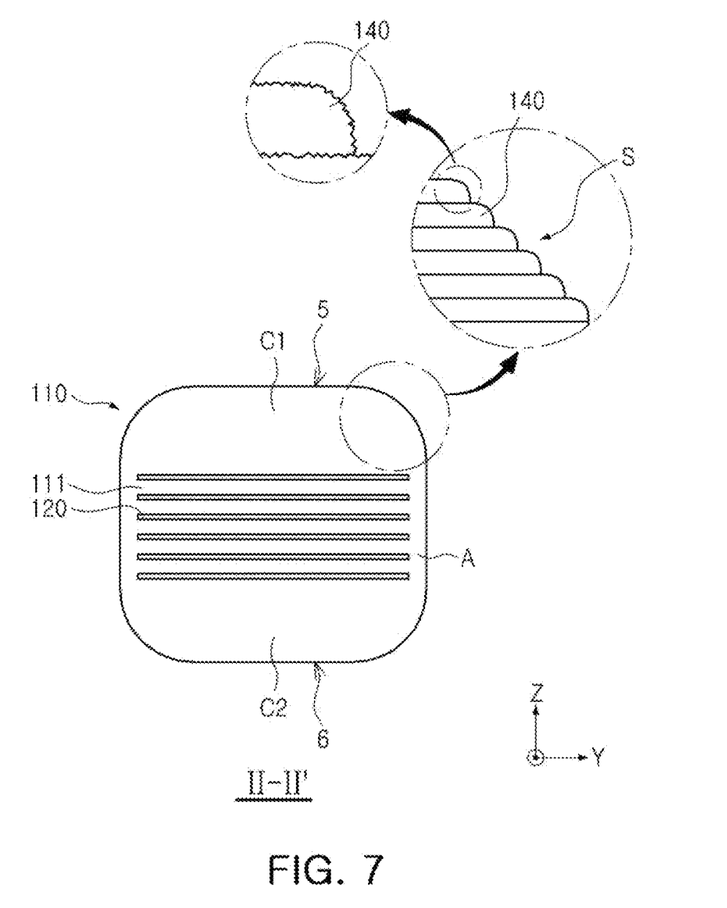
FIGS. 7 and 8 are respectively X-Z plane and Y-Z plane cross-sectional views of a multilayer electronic component according to another exemplary embodiment.
Figure 8:
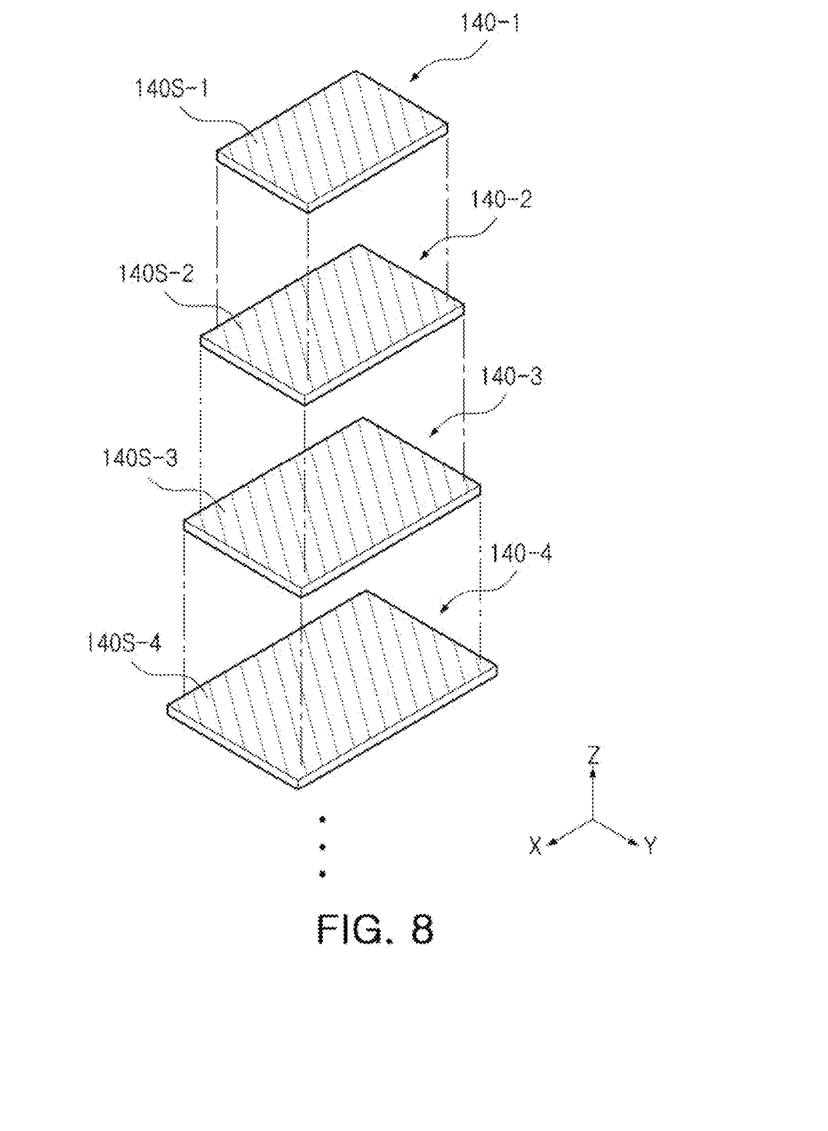
Figure 9:
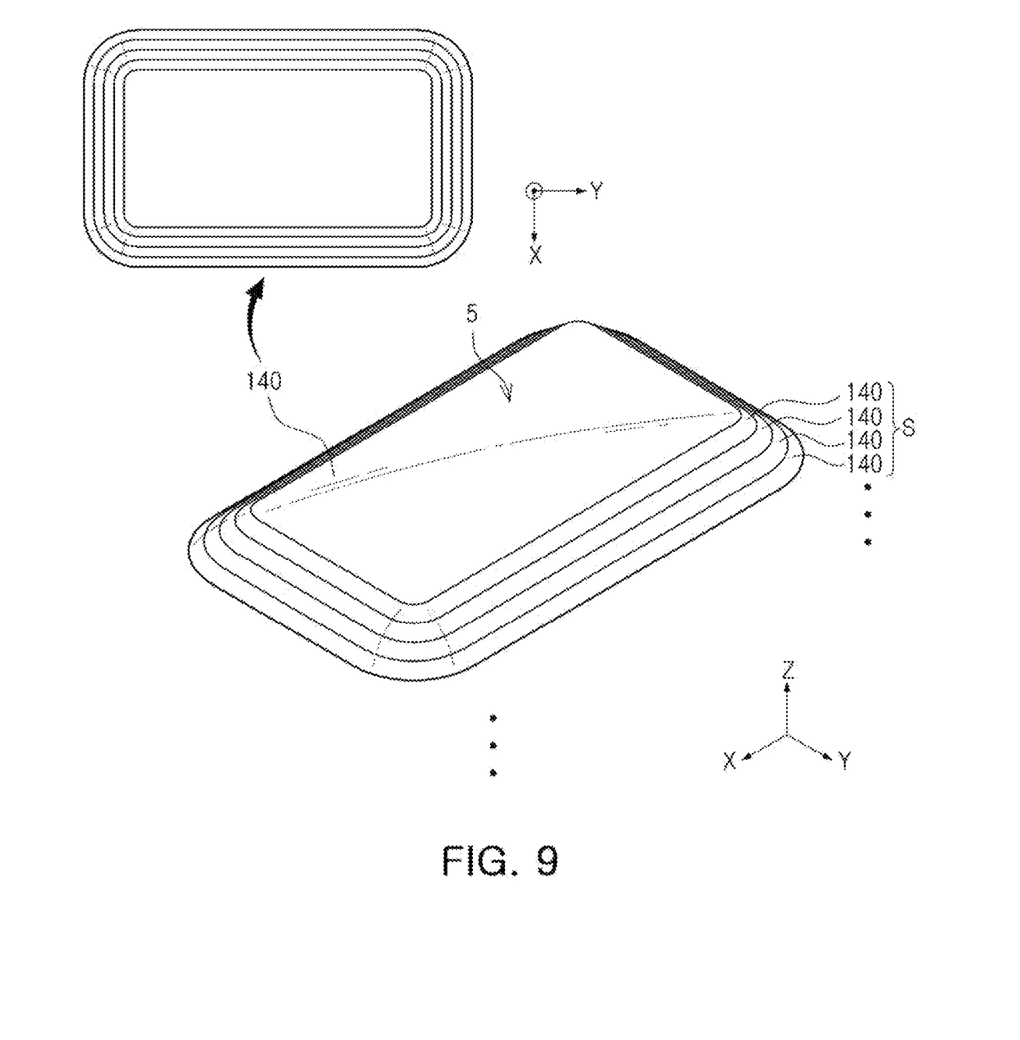
FIG. 9 is a perspective view and a Z-direction front view of a step structure of a multilayer electronic component according to an exemplary embodiment.

FIGS. 7 and 8 are respective X-Z plane and Y-Z plane cross-sectional views of a multilayer electronic component according to another exemplary embodiment.

Referring to FIGS. 7 and 8, each step-shape layer 140 may be formed such that the upper and side surfaces thereof form a curved surface instead of forming a right angle. As illustrated in FIG. 7, the plurality of step-shape layers 140 having a curve side surface are layered in the third direction (Z direction) and may have different lengths with respect to the first direction (X direction). Alternately, as illustrated in FIG. 8, the plurality of step-shape layers 140 may be layered in the third direction (Z direction) and may have different widths with respect to the second direction (Y direction). The plurality of step-shape layers 140 may have different lengths with respect to the first direction and different widths with respect to the second direction or different cross-sectional areas with respect to the third direction.

By having the curved side surfaces as above, additional breakage or cracking of the body 110 can be inhibited, due to the corners of the step-shape layer 140.

In this case, the step structure S may include the plurality of step-shape layers 140 having a smaller width as compared to the capacitance-forming portion A and having different widths from each other or a smaller length as compared to the capacitance-forming portion A and having different lengths from each other. Alternately, the step structure S may include the plurality of step-shape layers 140 having shorter length and width as compared to the capacitance-forming portion A.

Meanwhile, according to another exemplary embodiment, at least one of the upper cover portion C1 or the lower cover portion C2 has a shorter length and width and a higher side surface roughness as compared to the capacitance-forming portion A.

More specifically, at least one of the upper cover portion C1 or the lower cover portion C2 includes a step structure in which the length and width thereof are smaller than the capacitance-forming portion A, and the step structure S may be formed by layering the plurality of step-shape layers 140.

The side surfaces of the step-shape layers 140 may have higher roughness as compared to those of the capacitance-forming portion A. That is, as illustrated in FIG. 7, surfaces of the step-shape layers 140 are not smooth but irregular. Even after the plurality of step-shape layers 140 are layered, side surfaces of the step-shape layers 140 are outwardly exposed and can thus maintain surfaces having high roughness.

The above-described structure may be obtained by the side surfaces of the cover portions C1 and C2 not diced, in contrast to those of the capacitance-forming portion A, during manufacturing the same. Such surface roughness feature may be present in the exemplary embodiments of FIGS. 1 to 6 or that of FIG. 9.

FIG. 9 is a perspective view and a Z-direction front view of a step structure of a multilayer electronic component according to an exemplary embodiment. Referring to FIG. 9, side surfaces of the neighboring step-shape layers 140, among the step-shape layers 140 forming the step structure S, are continuously connected to each other.

More specifically, the side surfaces of the step-shape layers 140 are curved but may be disposed such that contact cross-sections of the neighboring step-shape layers 140 are the same in size. Accordingly, the side surface of the step structure S, in which the plurality of step-shape layers 140 are layered, may be formed to be smooth without having any protrusion.

By the side surface of the step structure S integrally formed without having any protrusion, additional breakage or cracking of the body 110, which may be caused by a protrusion, can be prevented. Further, a corner coverage defect, which may be caused by the external electrodes 130 not applied to gaps between the protruded regions when the external electrodes 130 are applied onto both side surface of the body 110, can be also prevented.

Figure 10:
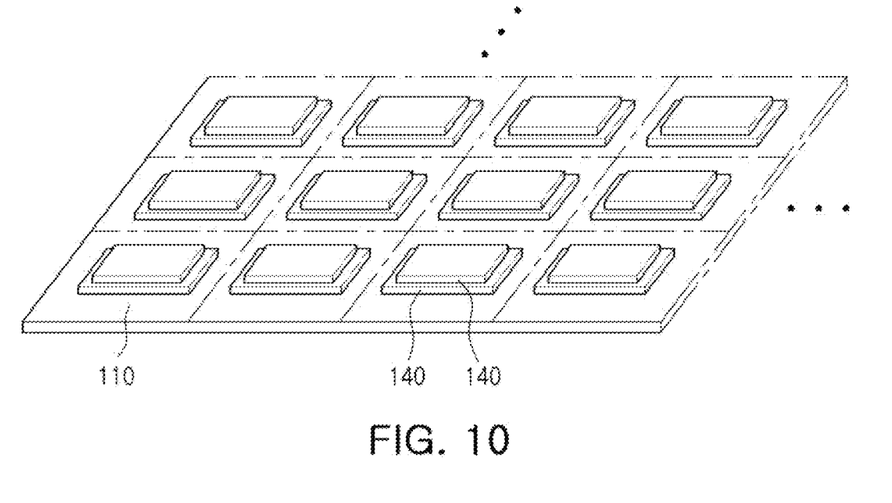
FIG. 10 is a diagram exemplifying a process of manufacturing a step structure of a multilayer electronic component according to an exemplary embodiment.

FIG. 10 is a diagram exemplifying a process of manufacturing a step structure of a multilayer electronic component according to an exemplary embodiment.

Similarly to the previously described printing method of the conductive paste, the screen printing method, gravure printing method, or the like, may be employed to manufacture the step structure S. For example, in the case of employing the screen printing method, the step-shape layers 140 may be layered by sequentially printing the same one layer by one layer as illustrated in FIG. 10.

In this case, the step structure S is formed by printing the step-shape layer 140 having a largest cross-sectional area first and then those having gradually reducing cross-sectional areas. That is, when the plurality of step-shape layers 140 are layered to have gradually reducing cross-sectional areas in an upward direction, the shape of the step structure S included in the upper cover portion C illustrated in FIGS. 1 to 6 may be achieved.

Further, when manufacturing the step structure S included in the lower cover portion C2, the step-shape layers 140 are sequentially printed as illustrated in FIG. 10, followed by reversing the upper and lower portions thereof upside down. This may result in a lowermost step-shape layer having a smallest cross-sectional area and serve to achieve the step structure S included in the lower cover portion C2 as illustrated in FIGS. 1 to 6.

Meanwhile, when the plurality of step-shape layers 140 are sequentially printed and layered, the side surfaces of the step-shape layers 140 may have higher roughness as compared to those of the capacitance-forming portion A.

More specifically, as illustrated in FIG. 10, the body 110, which is a unit body, may be obtained by dicing a layered body. In this case, the plurality of step-shape layers 140 may be printed and layered in an upper portion of the body 110 before the layered body is diced. A length and a width of the step-shape layer 140 may be smaller than those of the body 110 disposed therebelow. Accordingly, the step-shape layers 140 may not be diced when the layered body is diced into a plurality of bodies 110.

When the dicing is carried out as the above, the body 110 is managed to have smooth side surfaces as the side surfaces have been cut, whereas the side surfaces of the step-shape layers 140 have not been cut and can thus be maintained in a layered state after being printed. That is, the side surfaces of the step-shape layers 140 are managed to have roughness of surfaces smoothly formed by the screen printing method, or the like. Accordingly, the side surfaces of the body 110 and those of the step-shape layers 140 may have different surface roughness after dicing.

Further, a portion of the body 110, in which no dicing is performed, corresponds to the capacitance-forming portion A, and the step-shape layer 140, which is not subject to dicing, may form the cover portions C1 and C2. Accordingly, the side surfaces of the cover portions C1 and C2 including the step structure S may have higher roughness than those of the capacitance-forming portion A.

According to an exemplary embodiment, corners of a body are ground to be round, thereby preventing a chipping defect and a corner coverage defect of an external electrode.

Further, according to an exemplary embodiment, additional breakage of a chip due to grinding is prevented, and moisture resistance reliability is improved.

Various and advantageous advantages and effects of the present invention are not limited to the above description, and can be more easily understood in the course of describing a specific embodiment of the present disclosure.

While the exemplary embodiments have been shown and described above, it will be apparent to those skilled in the art that modifications and variations could be made without departing from the scope of the present invention as defined by the appended claims.

What is claimed is:

1. A multilayer electronic component, comprising:
   a body comprising a capacitance-forming portion including a dielectric layer and a plurality of internal electrodes layered with the dielectric layer interposed therebetween, and upper and lower cover portions disposed on upper and lower surfaces of the capacitance-forming portion, respectively; and
   external electrodes disposed on the body and electrically connected to at least some of the plurality of internal electrodes, respectively,
   wherein at least one of the upper cover portion or the lower cover portion has a step structure, and
   wherein the step structure has a shorter length and width as compared to the capacitance-forming portion.

2. The multilayer electronic component of claim 1, wherein the external electrodes include first and second external electrodes opposing each other in a first direction of the body, and
   the body comprises first and second surfaces opposing each other in the first direction, third and fourth surfaces connected to the first and second surfaces and opposing each other in a second direction, and fifth and sixth surfaces connected to the first to fourth surfaces and opposing each other in a third direction.

3. The multilayer electronic component of claim 2, wherein the upper and lower cover portions each have the step structure and are symmetric in the third direction.

4. The multilayer electronic component of claim 2, wherein the upper and lower cover portions each comprise a plurality of step-shape layers layered in the third direction and having different lengths from each other with respect to the first direction.

5. The multilayer electronic component of claim 4, wherein the plurality of step-shape layers included in the upper cover portion have shorter lengths with respect to the first direction as disposed closer to the fifth surface, and
   the plurality of step-shape layers included in the lower cover portion have shorter lengths with respect to the first direction as disposed closer to the sixth surface.

6. The multilayer electronic component of claim 2, wherein the upper and lower cover portions each have a plurality of step-shape layers layered in the third direction and having different widths from each other with respect to the second direction.

7. The multilayer electronic component of claim 6, wherein the plurality of step-shape layers included in the upper cover portion have shorter widths with respect to the second direction as disposed closer to the fifth surface, and
   the plurality of step-shape layers included in the lower cover portion have shorter widths with respect to the first direction as disposed closer to the sixth surface.

8. The multilayer electronic component of claim 2, wherein the upper and lower cover portions comprise a plurality of step-shape layers having same thicknesses as each other and different cross-sectional areas from each other with respect to the third direction.

9. The multilayer electronic component of claim 8, wherein neighboring step-shape layers, among the plurality of step-shape layers, have side surfaces continuously connected to each other.

10. The multilayer electronic component of claim 8, wherein the plurality of step-shape layers have curved side surfaces.

11. The multilayer electronic component of claim 1, wherein a corner of the body has a round shape in a region in which the step structure is disposed.

12. The multilayer electronic component of claim 11, wherein a radius of curvature of the round shape is 0.7 to 1 with respect to a thickness of the upper or lower cover portion.

13. The multilayer electronic component of claim 1, wherein at least one of the upper cover portion or the lower cover portion has a plurality of step structures.

14. The multilayer electronic component of claim 8, wherein the at least one of the upper cover portion or the lower cover portion having the step structure further includes an irregular layer not formed with the step structure.

15. A multilayer electronic component, comprising:
a body comprising a capacitance-forming portion including a dielectric layer and a plurality of internal electrodes layered with the dielectric layer interposed therebetween, and upper and lower cover portions disposed on upper and lower surfaces of the capacitance-forming portion, respectively; and
external electrodes disposed on the body and electrically connected to at least some of the plurality of internal electrodes, respectively,
wherein at least one of the upper cover portion or the lower cover portion has a shorter length and width and a higher side surface roughness as compared to the capacitance-forming portion.

16. The multilayer electronic component of claim 15, wherein at least one of the upper cover portion or the lower cover portion has a step structure,
wherein the step structure comprises a plurality of step-shape layers having smaller widths as compared to the capacitance-forming portion and having different widths from each other.

17. The multilayer electronic component of claim 15, wherein at least one of the upper cover portion or the lower cover portion has a step structure, wherein the step structure comprises a plurality of step-shape layers having shorter lengths as compared to the capacitance-forming portion and having different lengths from each other.

18. A multilayer electronic component, comprising:
a body comprising a capacitance-forming portion including a dielectric layer and a plurality of internal electrodes layered with the dielectric layer interposed therebetween in a thickness direction, and upper and lower cover portions disposed on upper and lower surfaces of the capacitance-forming portion, respectively, in the thickness direction; and
external electrodes disposed on the body and electrically connected to at least some of the plurality of internal electrodes, respectively,
wherein at least one of the upper cover portion or the lower cover portion has a plurality of step-shape layers layered in the thickness direction, and
the plurality of step-shape layers have different cross-sectional areas from each other with respect to the thickness direction, the cross-sectional areas decreasing as being closer to an external surface of the body.

19. The multilayer electronic component of claim 18, wherein the plurality of step-shape layers have curved side surfaces.

20. The multilayer electronic component of claim 18, wherein the plurality of step-shape layers form a step structure such that side surfaces of the step-shape layers have right angles.

* * * * *